(12) United States Patent
Maitre et al.

(10) Patent No.: US 11,127,565 B2
(45) Date of Patent: Sep. 21, 2021

(54) ELECTRON-BEAM LITHOGRAPHY PROCESS ADAPTED FOR A SAMPLE COMPRISING AT LEAST ONE FRAGILE NANOSTRUCTURE

(71) Applicants: CENTRE NATIONAL DE LA RECHERCHE SCIENTIFIQUE, Paris (FR); SORBONNE UNIVERSITE, Paris (FR); UNIVERSITE PARIS DIDEROT—PARIS, Paris (FR)

(72) Inventors: Agnès Maitre, Paris (FR); Amit Raj Dhawan, Paris (FR); Pascale Senellart, Orsay (FR); Cherif Belacel, Paris (FR)

(73) Assignees: CENTRE NATIONAL DE LA RECHERCHE SCIENTIFIQUE, Paris (FR); SORBONNE UNIVERSITE, Paris (FR); UNIVERSITE PARIS DIDEROT—PARIS, Paris (FR)

( * ) Notice: Subject to any disclaimer, the term of this patent is extended or adjusted under 35 U.S.C. 154(b) by 154 days.

(21) Appl. No.: 16/486,061

(22) PCT Filed: Feb. 12, 2018

(86) PCT No.: PCT/EP2018/053398
§ 371 (c)(1),
(2) Date: Aug. 14, 2019

(87) PCT Pub. No.: WO2018/149777
PCT Pub. Date: Aug. 23, 2018

(65) Prior Publication Data
US 2020/0006037 A1   Jan. 2, 2020

(30) Foreign Application Priority Data
Feb. 15, 2017 (EP) ..................................... 17305169

(51) Int. Cl.
*H01J 37/317* (2006.01)
*G01N 21/64* (2006.01)
(Continued)

(52) U.S. Cl.
CPC ...... *H01J 37/3174* (2013.01); *G01N 21/6408* (2013.01); *G03F 7/7045* (2013.01);
(Continued)

(58) Field of Classification Search
CPC .......... G01N 21/6408; G01N 21/6445; G01N 21/6458; G01N 21/6489; G02B 21/002;
(Continued)

(56) References Cited

U.S. PATENT DOCUMENTS

2006/0098188 A1   5/2006  Buijsse et al.
2008/0157404 A1   7/2008  Fried et al.
(Continued)

FOREIGN PATENT DOCUMENTS

| CN | 104678716 A | 6/2015 |
| EP | 2738607 A1 | 6/2014 |
| WO | 2016/013930 A1 | 1/2016 |

OTHER PUBLICATIONS

International Search Report and Written Opinion, dated Jun. 12, 2018, from corresponding PCT application No. PCT/EP2018/053398.
(Continued)

*Primary Examiner* — Peter B Kim
(74) *Attorney, Agent, or Firm* — Nixon & Vanderhye

(57) ABSTRACT

Disclosed is a lithography process on a sample including at least one structure and covered by at least a lower layer of resist and a upper layer of resist the process including: using an optical device to image or determine, in reference to the optical device, a position of the selected structure and positions of markers integral with the sample; using an
(Continued)

Figures 1A, 1B, 1C:
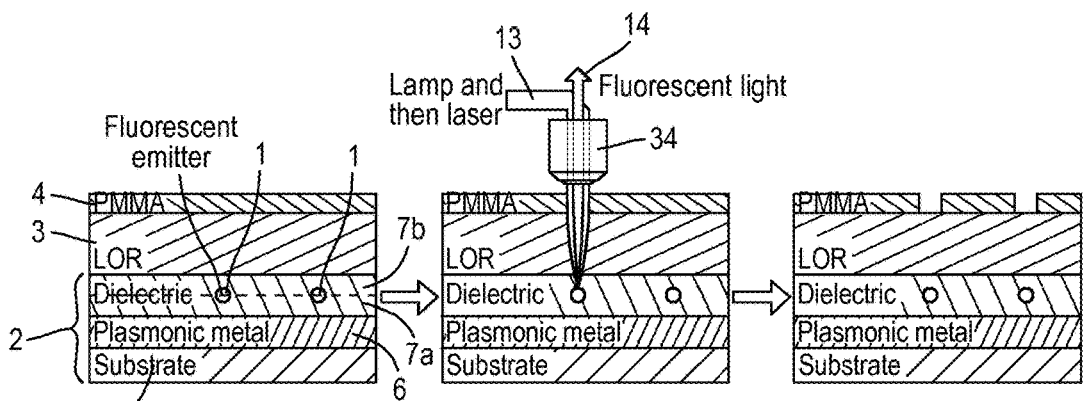

electron-beam device, imaging or determining the position of each marker in reference to the electron-beam device; deducing the position of the selected structure in reference to the electron-beam device; exposing to an electron beam the upper layer of resist above the position of the selected structure to remove all the thickness of the upper layer of resist above the position of the selected structure but none or only part of the thickness of the lower layer of resist above the position of the selected structure.

20 Claims, 5 Drawing Sheets

(51) Int. Cl.
  *G03F 7/20* (2006.01)
  *G03F 9/00* (2006.01)
(52) U.S. Cl.
  CPC ............ *G03F 9/708* (2013.01); *G03F 9/7084* (2013.01); *H01J 2237/3175* (2013.01)
(58) Field of Classification Search
  CPC .... G03F 7/70383; G03F 7/7045; G03F 9/708; G03F 9/7084; H01J 2237/3175; H01J 2237/31769; H01J 37/3174; B82Y 40/00
  See application file for complete search history.

(56) References Cited

U.S. PATENT DOCUMENTS

| | | |
|---|---|---|
| 2013/0200262 A1 | 8/2013 | Kruit et al. |
| 2013/0270596 A1 | 10/2013 | Senellart et al. |
| 2014/0302442 A1 | 10/2014 | Schell et al. |
| 2017/0221675 A1 | 8/2017 | Hoogenboom et al. |
| 2019/0369500 A1* | 12/2019 | Maitre .................. G03F 9/7084 |

OTHER PUBLICATIONS

European Patent Office, The Hague, NL, "Laser direct writing photolithographic system combined with single quantum dot locating function and method thereof", Jun. 3, 2015, Database EPODOC, XP002772422.

European Search Report, dated Aug. 7, 2017, from corresponding EP application No. EP 17 30 5169.

* cited by examiner

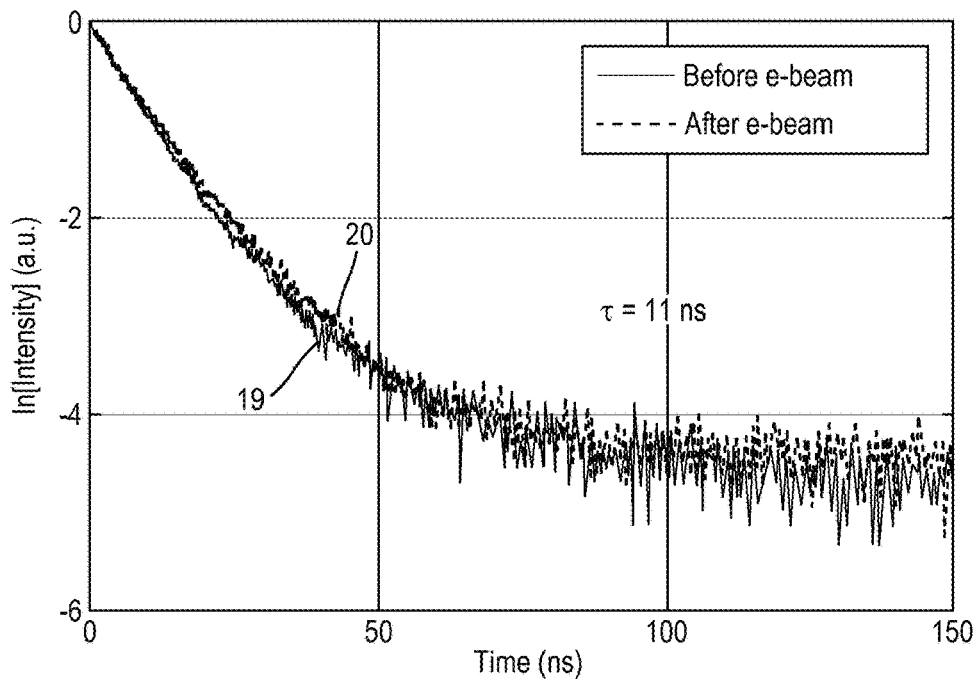
FIG. 7
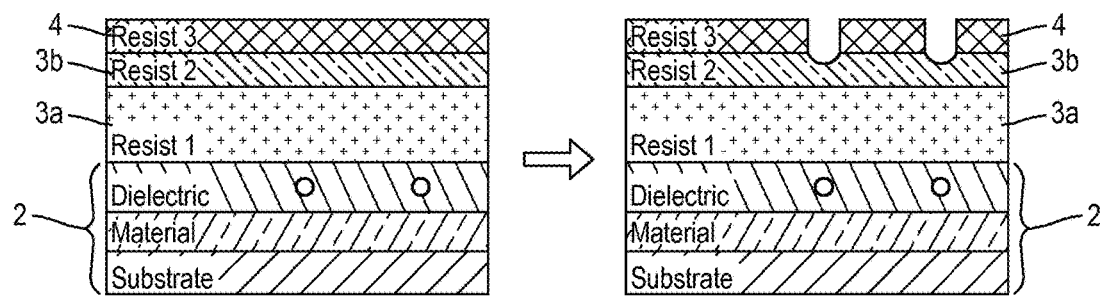
FIG. 8a
FIG. 8b
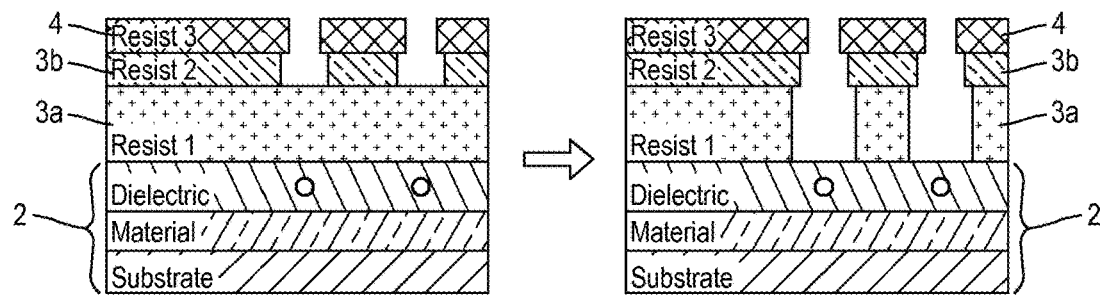
FIG. 8c
FIG. 8d

ELECTRON-BEAM LITHOGRAPHY PROCESS ADAPTED FOR A SAMPLE COMPRISING AT LEAST ONE FRAGILE NANOSTRUCTURE

TECHNICAL FIELD

The present invention relates to a lithography process.

STATE OF THE ART

Photonic and plasmonic nanostructures within which individual (or aggregates) fluorescent nanoemitters like quantum dots, nitrogen vacancy centers in nanodiamonds, and fluorescent molecules are placed with nanometric precision find applications in many fields like single photon emission and plasmonics, and these structures serve as an ideal tool for investigating light-matter interactions at a single emitter level. The fabrication of such structures requires nanometric lateral and vertical control over placing the nanoemitter inside the structure. For this purpose, lithography has to be performed around nanoemitters, without destroying them. This task becomes very difficult when dealing with individual nanoemitters because an individual emitter is not as robust and bright as an aggregate of emitters.

It is very difficult to perform lithography on sensitive individual emitters like colloidal CdSe/CdS quantum dots, because the lithography has to be carried out right above the emitter but the laser intensity required to perform the lithography photobleaches and thus destroys the concerned emitter, thus making the process fail.

An object of this invention is to propose a lithography process that can be performed on fragile emitters (in particular individual or single emitters) with limited risks to photobleach or destroy the emitters compared to prior art, preferably at the nanometer scale.

SUMMARY OF THE INVENTION

An aspect of the invention concerns a lithography process on a sample comprising at least one structure, said process comprising:
  putting above the sample at least two layers of resist comprising a lower layer of resist in contact with the sample and an upper layer of resist above the lower layer of resist,
  using an optical device, receiving a radiation from a selected structure and imaging or determining, with reference to the optical device, a position of the selected structure and positions of markers (preferably at least three markers) integral with the sample,
  using an electron-beam device, imaging or determining the position of each marker with reference to the electron-beam device,
  using:
    the position of each marker with reference to the electron-beam device, and
    the position of the selected structure and the positions of the markers with reference to the optical device
  deducing the position of the selected structure with reference to the electron-beam device,
  using the electron-beam device, exposing to an electron beam the upper layer of resist above the position of the selected structure in order to remove all the thickness of the upper layer of resist above the position of the selected structure but no part or only an incomplete part of the thickness of the lower layer of resist above the position of the selected structure.

The process according to the invention can comprise, after removing all the thickness of the upper layer of resist above the position of the selected structure, another removing step comprising removing (preferably using a solvent or a chemical solution) at least a part of the remaining thickness of the lower layer of resist above the position of the selected structure.

Imaging or determining the position of the selected structure with reference to the optical device can comprise a step of acquiring an image imaging the markers and a fluorescence radiation from the selected structure.

The markers can be made by optical lithography.

The markers can be made by a laser with the same optical device used for imaging or determining, with reference to the optical device, a position of the selected structure.

The markers can be made at least on the upper layer of resist, preferably on the lower layer of resist and on the upper layer of resist.

The lower layer can have a thickness of at least 50 nm, preferably at least 200 nm.

The upper layer can have a thickness of less than 5 µm, preferably less than 400 nm.

The process according to the invention can comprise, before the steps of exposing to an electron beam the upper layer of resist and removing all the thickness of the upper layer of resist above the position of the selected structure, a step of selecting the selected structure based on the radiation from the selected structure.

The step of selecting the selected structure can be based:
  on a wavelength and/or
  on a polarization and/or
  on an intensity and/or
  on bunched or antibunched emission characteristics
of the radiation from the selected structure and/or an estimated lifetime of the selected structure.

The process according to the invention can comprise a step of depositing a metallic layer (preferably in contact with the sample) above the position of the selected structure, where all the thickness of the upper layer of resist have been removed.

The at least one structure can be comprised in the sample inside a structure layer. The at least one structure can be comprised in the sample between two layers of the same dielectric material forming the structure layer. Furthermore:
  one first side of the structure layer can be in contact with one of the at least two layers of resist, and/or
  one second side of the structure layer can be in contact with a metallic layer or a Bragg mirror.

Each structure can be a fluorescent emitter (like a quantum dot, a nitrogen vacancy center in a nanodiamond, or a fluorescent molecule), or any structure (fluorescent or non-fluorescent) that can be detected by transmission or reflection microscopy.

DETAILED DESCRIPTION OF THE FIGURES AND OF REALIZATION MODES OF THE INVENTION

Figures 1D, 1E, 1F:
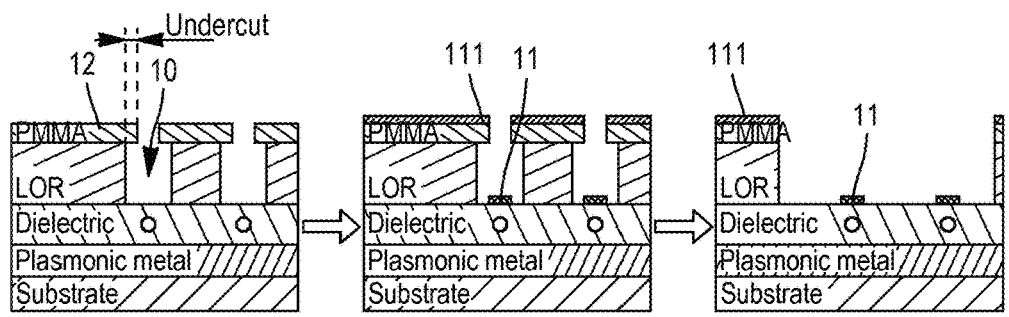
Figure 2:
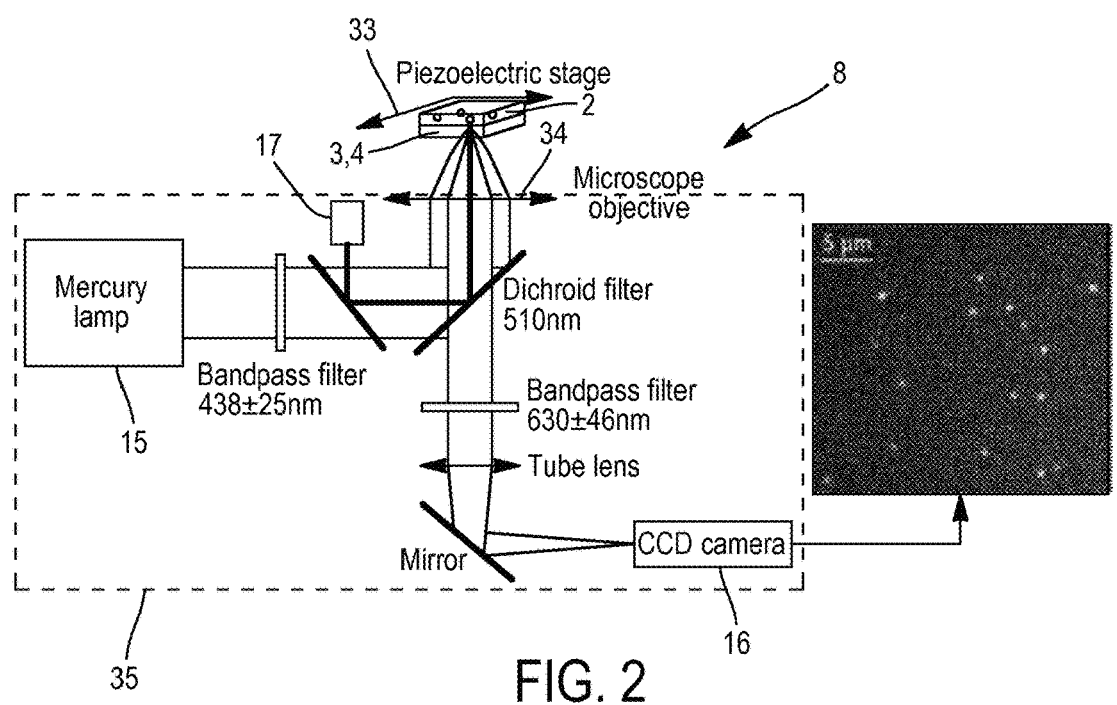
Figure 3:
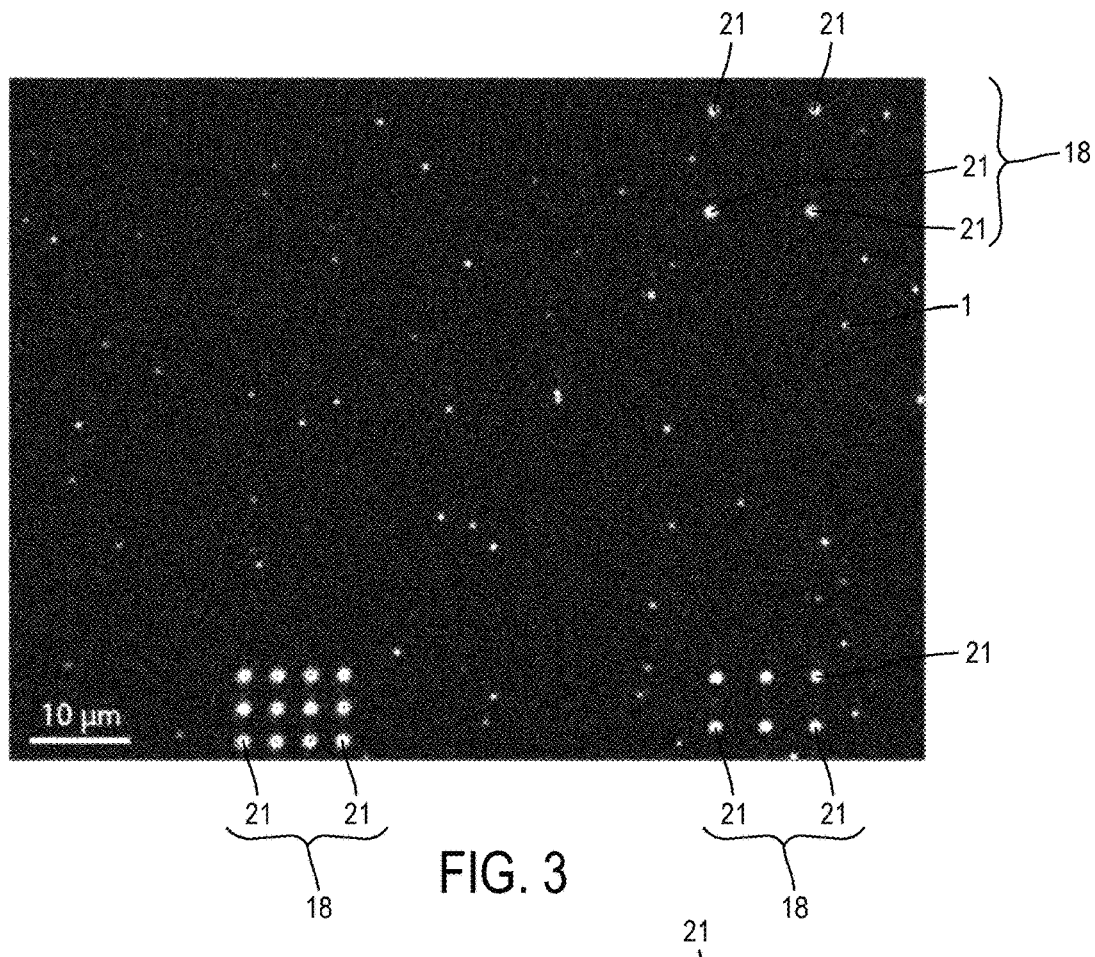
Figure 4:
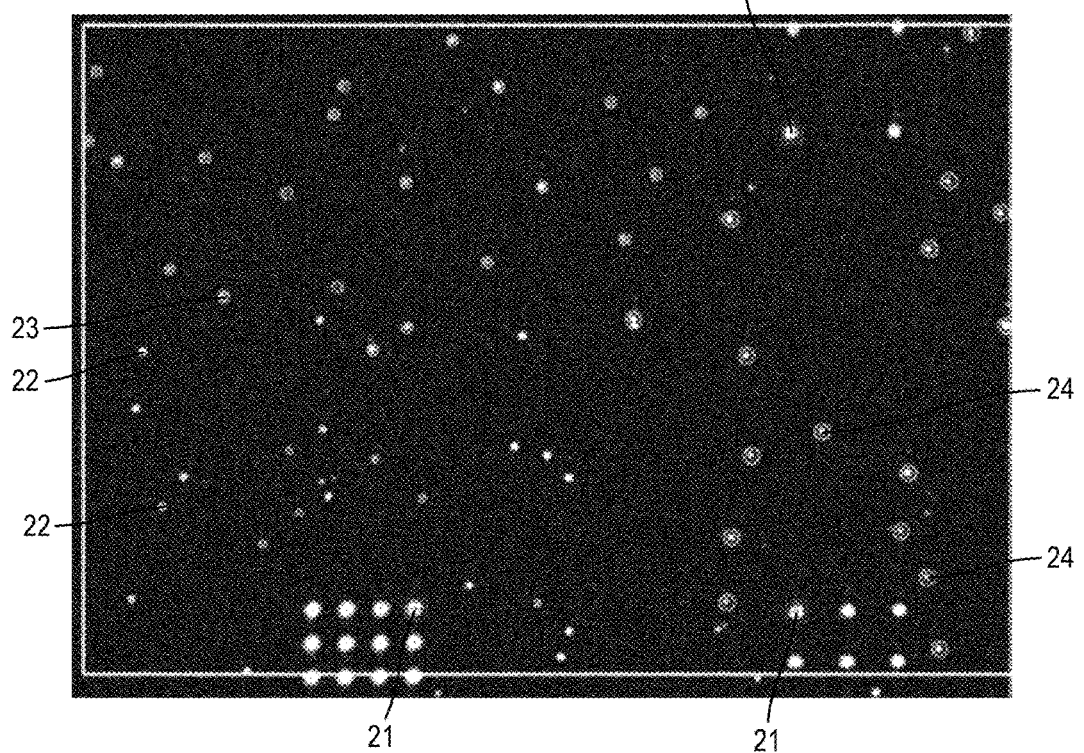
Figure 5:
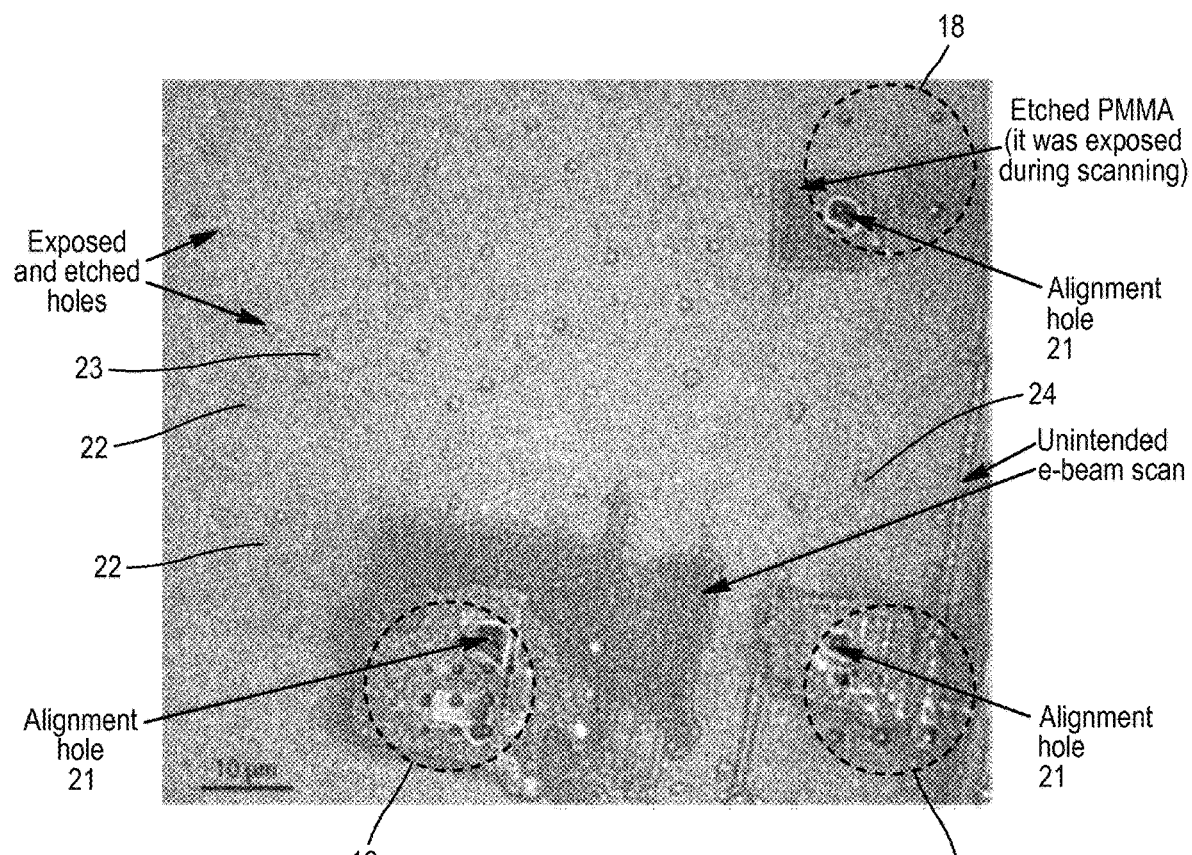
Figure 6:
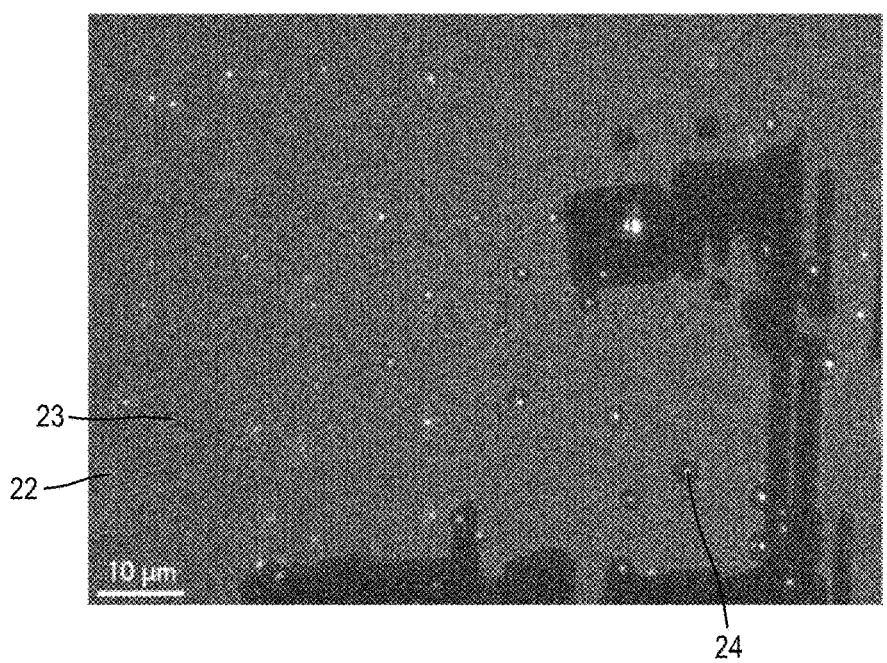
Figure 9:
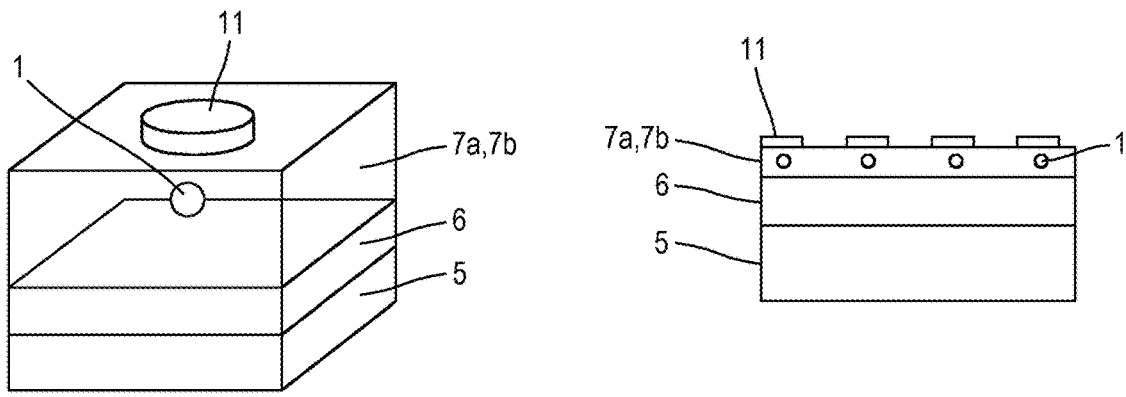
Figure 10:
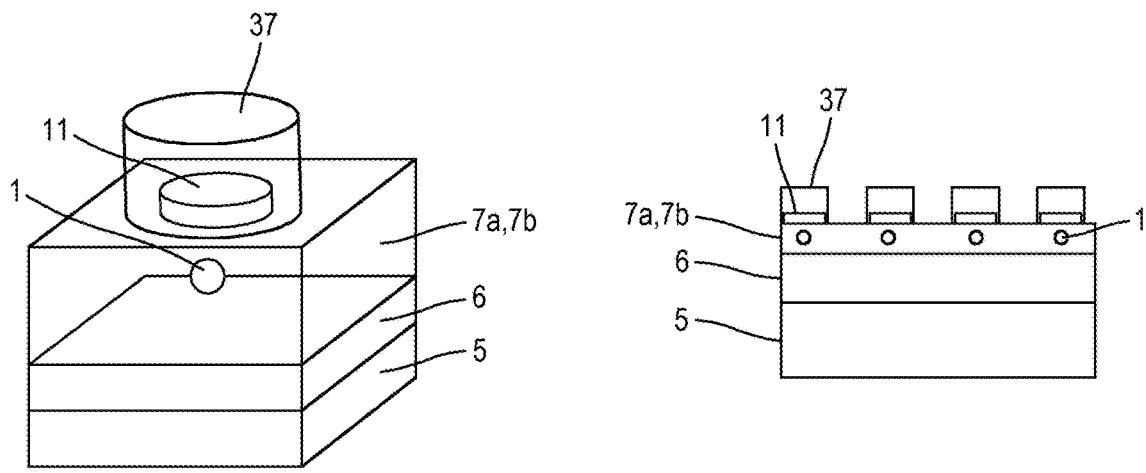
Figure 11:
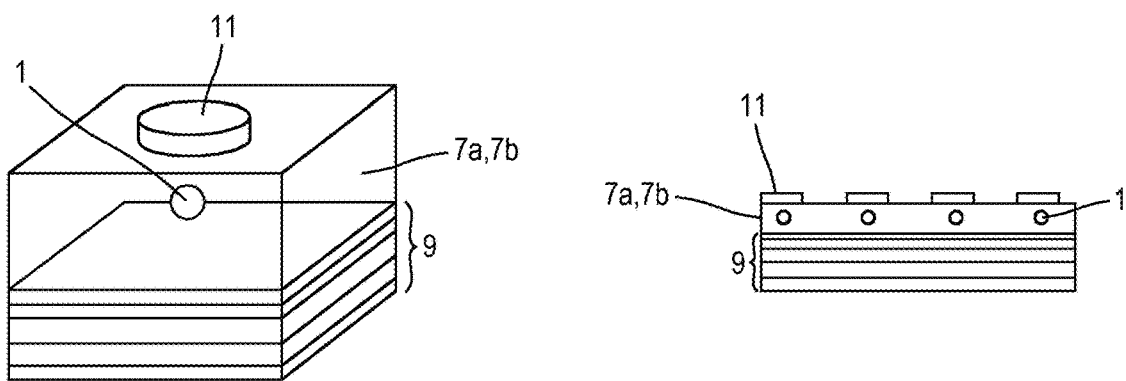

Other advantages and characteristics of the invention will appear upon examination of the detailed description of embodiments which are in no way limitative, and of the appended drawings in which:

FIGS. 1(a) to 1(f) are side views of a sample 2 illustrating different steps of an embodiment of a process according to the invention which is a best realization mode; this embodiment is described in the particular case of manufacturing a plasmonic patch antenna FIG. 2 illustrates the optical device 8 for implementing step 1(b) of the process of FIG. 1, FIG. 3 is a fluorescence image of emitters 1 and markers 21 made with the optical device 8, FIG. 4 shows an electron beam writing exposure pattern drawn on the fluorescence image of FIG. 3, FIG. 5 is a reflection microscopy image of sample 2 after etching the parts of top resist layer 4 (PMMA) exposed to the electron beam, FIG. 6 is a fluorescence microscopy image of the working area after the chemical development of bottom resist layer 3, FIG. 7 illustrates the measurement of the lifetime of a selected structure 1 (CdSe/CdS quantum dot) before the electron-beam lithography (line 19) and after the electron-beam lithography (line 20), FIGS. 8(a) to 8(d) are side views of a sample 2 illustrating different steps of a variant of the embodiment of a process according to the invention, FIGS. 9 to 11 illustrate other structures that can be manufactured by the process according to the invention:

FIG. 9 is a partial perspective view (left) and a side view (right) of plasmonic patch antennas FIG. 10 is a partial perspective view (left) and a side view (right) of metallo-dielectric antennas FIG. 11 is a partial perspective view (left) and a side view (right) of Tamm structures These embodiments being in no way limitative, we can consider variants of the invention including only a selection of characteristics subsequently described or illustrated, isolated from other described or illustrated characteristics (even if this selection is taken from a sentence containing these other characteristics), if this selection of characteristics is sufficient to give a technical advantage or to distinguish the invention over the state of the art. This selection includes at least one characteristic, preferably a functional characteristic without structural details, or with only a part of the structural details if that part is sufficient to give a technical advantage or to distinguish the invention over the state of the art.

We are going to describe an embodiment of a process according to the invention in which:
  fluorescent emitters 1 (individual or aggregates) like quantum dots (colloidal or epitaxial), fluorescent molecules, and nitrogen vacancy centers in nanodiamonds with specific properties (emission intensity, wavelength, orientation, polarization, etc.) are imaged by fluorescence microscopy (using a mercury lamp 15 and appropriate optical filters) and
  alignment markers 21 (for electron-beam lithography) are created around the emitters 1 by means of optical lithography (carried out by a laser 17) on two layers 3, 4 of resist covering the emitters 1.

A fluorescence microscopy image, which includes the selected fluorescent emitters 1 of interest and the alignment markers 21, is used to draw an electron-beam writing pattern. Upon aligning the scanning electron microscopy scans of the alignment markers 21 with the fluorescence microscopy image, electron-beam lithography is performed on the selected nanoemitters 1 which are embedded beneath the two layers 3, 4 of resist. The upper resist layer 4 is an electron resist, and the lower resist layer 3 prevents the electrons of the electron-beam lithography from damaging the fluorescent emitters 1 below it and serves in a liftoff step as well. Further, the deposition and liftoff steps of the lithography procedure are carried out and the desired devices are fabricated.

We are now going to describe in details, in reference to FIGS. 1 to 7, this embodiment of a process according to the invention and a system for implementing this process embodiment according to the invention.

This lithography process embodiment according to the invention uses a combination of optical lithography and e-beam lithography to deterministically position metal patches 11 on individual or multiple fluorescent emitters 1.

This lithography process embodiment according to the invention is implemented on a sample 2 comprising at least one structure 1.

Each structure 1 is an individual light emitter 1 (i.e. a structure capable of emitting one single photon at a time) or an aggregate light emitter 1 (formed by an assembly of a plurality of individual structures 1). Each structure 1 is preferably an individual light emitter 1.

Each emitter is a nano-emitter, i.e. an emitter having a volume that can completely enter inside a sphere having a 100 nm diameter.

Each light emitter 1 is something that emits light after absorbing photons. The absorbed photons can be optical, ultraviolet, infrared, or in general, from any part of the electromagnetic spectrum.

Each structure 1 is typically a quantum dot, a nitrogen vacancy center in a nanodiamond, or a fluorescent molecule.

In the particular case of embodiment of FIGS. 3 to 7, each structure 1 is a colloidal CdSe/CdS quantum dot, more precisely a CdSe/CdS core/shell colloidal quantum dot.

The at least one structure 1 is comprised in the sample 2 inside a structure layer 7a, 7b.

As illustrated in FIG. 1(a), the at least one structure 1 is comprised in the sample between two layers 7a, 7b, preferably two layers 7a, 7b of the same dielectric material forming the structure layer, typically PMMA (polymethyl methacrylate).

The sample 2 comprises an intermediate layer 6 comprised between a substrate 5 (typically a silicon wafer) and the structure layer 7a, 7b. The intermediate layer 6 is a metallic layer 6. In the particular case of embodiment of FIGS. 3 to 7, gold (Au) was chosen as the plasmonic metal.

The sample 2 is prepared as follow:
  on the wafer 5 (e.g., a silicon wafer), the optically thick layer 6 (~200 nm) of a plasmonic metal (e.g., gold or silver) is deposited by plasma vapor deposition.
  then the layer of a dielectric material 7a is deposited (e.g., by spincoating) on it. The typical thickness of layer 7a is comprised between 0 nm and 2 μm.
  then on top of the dielectric layer 7a, individual or multiple fluorescent structures 1 (e.g., quantum dots, nitrogen vacancy centers in nanodiamonds, etc.) are dispersed in liquid (hexane for CdSe/CdS quantum dots; or toluene or chloroform, etc.). This dispersion is spincoated.
  then the other layer of a dielectric material 7b is deposited. The typical thickness of layer 7b is comprised between 0 nm and 200 nm. Finally we have a layer of a dielectric material 7a, 7b with embedded individual structure 1 or multiple fluorescent structures 1.

As illustrated in FIG. 1(a), the process embodiment according to the invention comprises the step of putting at least two layers 3, 4 of resist above the sample 2.

The at least two layers 3, 4 of resist comprises two layers of two different resists, the two layers comprising a lower layer 3 of lower resist (LOR) in contact with the sample 2 and a second (or upper) layer 4 of upper resist (PMMA) above (preferably in contact with) the lower layer 3.

More precisely, above the dielectric layer 7a, 7b, a layer 3 of LOR®5A resist (~500 nm in thickness) is spincoated and baked. LOR®5A is a commercial lithography liftoff resist manufactured by MicroChem Corp.

Above the LOR®5A layer 3, a 50 nm thick layer 4 of PMMA (polymethyl methacrylate) is spincoated and baked.

Lower layer 3 is thicker (preferably at least three times thicker) than upper layer 4.

At this step:
one first side of the structure layer 7a, 7b is in contact with the lower layer 3 of resist.
one second side of the structure layer 7a, 7b is in contact with the metallic layer 6.

The second (or upper) layer 4 has a thickness of less than 400 nm, preferably of less than 100 nm, preferably less than 60 nm. The choice of the thickness of the resist of layer 4 depends on the nature of the resist (its chemical nature and density) and the energy of electrons of the beam, given that we are able to observe the emitters below the resist layers. To confirm the thicknesses of the resists of layers 3 and 4, and electron exposure parameters (electron voltage, working distance, aperture, electron dose) a dose test is performed. The results of several dose tests allow to define the type and thicknesses of the resists 3, 4.

Thickness of layer 4 is experimentally chosen thin enough in order to allow imaging of emitters 1 below the resists 3, 4 by optical microscopy.

The upper resist 4 is an electron resist (i.e. a resist sensitive to electron-beam lithography; or in other words a resist on which electron beam lithography can be performed). By locally exposing this resist 4 to low energy electrons of an electron-beam, the exposed part can be removed as intended. A low electron dose exposure is possible because a very thin upper resist layer 4 is used. A thin film electron resist can be used because we do not solely rely upon exposure of resist 4 to electron-beam lithography for the the creation of an undercut 12 in the electron resist 4. As we will see below, the undercut 12 in the electron resist 4 is created by chemically etching the lower resist 3, and therefore a successful liftoff become possible.

The first (or lower) layer 3 has a thickness of at least 50 nm, preferably at least 200 nm, preferably at least 400 nm. The lower resist 3 prevents the destructive penetration of electrons into the emitter(s) 1 (lying just below). By using an appropriate solvent, the lower resist 3 is selectively removed and a planned structure is created. Moreover, the removal of the lower resist 3 creates an undercut 12 in the upper resist 4, and this helps in the final liftoff.

The lower resist 3 can be an electron resist, but this is not necessary.

Thickness of layer 3 is experimentally chosen between the two following constraints:
thin enough in order to allow imaging of emitters 1 below the resists 3, 4 by optical microscopy, and
thick enough to prevent the destructive penetration of electrons into the emitter(s) 1.

The lower resist 3 and/or the upper resist 4 is an optical lithography resist, i.e. a resist that can be exposed or burned by means of electromagnetic waves at appropriate wavelength and intensity (of laser 17), in order to create holes or markers 21 (preferably at least three markers, as described hereinafter) at least in the upper resist 4.

Markers 21 are visible to optical and electron microscopy.

In this particular embodiment, the lower resist (LOR) is an optical resist that could be burned by an optical (ultraviolet) laser beam of appropriate intensity, in such a way that the heat generated by the absorption of laser light by the lower resist evaporates the upper resist (PMMA) located above the heated area, thus leaving a hole in the upper resist.

The luminescence of the at least two layers 3, 4 of resist is very low. Therefore, relatively less bright individual fluorescent emitters 1 can be observed easily without any unintended exposure problems.

The process embodiment according to the invention then comprises the step of putting the sample 2 in an optical device 8, more precisely putting sample 2 on a motorized stage 33.

FIG. 2 illustrates the optical device 8. The optical device 8 comprises stage 33, a microscope 35, an objective 34 of the microscope 35, and a laser 17.

Stage 33 is a piezoelectric stage 33 located in front of the objective 34.

As illustrated in FIG. 1(b), the process embodiment according to the invention then comprises the steps of:
receiving, using the optical device 8, a fluorescence radiation 14 from each structure 1, sample 2 being on the stage 33, and
making, by optical lithography using a laser 17 (preferably the same optical device 8), markers 21 at least on the upper layer 4 of resist (and preferably also on the lower layer of resist 3), the sample 2 being on the stage 33. This avoids the extra step of creating metallic alignment markers, which is destructive for the sample 2 because the processes for cleaning the lithography residues of the deposition can damage the sample 2 and leave unwanted residues.

The sample 2 is imaged by fluorescence microscopy (using a microscope lamp 15 of microscope 35) and the emitters 1 are observed on the camera 16 of microscope 35 in an area of about 90×60 µm$^2$. An area with an appropriate density of emitters 1 is chosen, and at the edges of this area, alignments marks comprising three 2D lattices 18 of holes 21 are burnt with the laser 17 focused by the microscope objective 34 (optical lithography).

FIG. 2 illustrates:
excitation beam 13 from lamp 15 exciting the emitters 1 for imaging or determining their positions; FIG. 2 is only schematic, as objective 34 illuminates several emitters at the same time with the excitation beam 13.
Fluorescence light 14 emitted by each emitter 1 excited by beam 13 and collected by objective 34.

On sample 2, each hole 21 of the lattices 18 was burned by exposing the sample 2 to the focused beam of laser 17 (4.5 to 5 mW, continuous wave, 405 nm laser) for 3 seconds. The size of the imaged area depends on the field of view of the CCD camera 16 and the imaging optics.

FIG. 3 is a fluorescence image of the emitters 1 and the lattices of the burnt holes 21. The sample 2 is imaged with a 100× objective 34. Given the optical setup 8, the 1392× 1040 pixels on the image of CCD camera 16 corresponded to a real size of 92.17×68.86 µm$^2$. From this is deduced the length of 1 pixel on the CCD camera image as 66.21 nm.

The process embodiment according to the invention then comprises the step of imaging or determining, with reference to the optical device 8, a position of each structure 1 and positions of markers 21 integral with the sample 2.

Imaging or determining the position of each structure 1 with reference to the optical device 8 comprises a step of acquiring an image imaging the markers 21 and a fluorescence radiation 14 from each structure 1.

One corner hole 21 from each lattice 18 serves as an alignment marker for a upcoming electron beam lithography. The number of holes 21 in each lattice 18 is different, which makes them distinguishable: this allows designating a position to each fluorescing emitter 1 in the CCD (charged coupled device) camera image and helps in orienting the sample 2 throughout the protocol.

The process embodiment according to the invention then comprises (before the steps of exposing to an electron beam the upper layer 4 of resist and removing all the thickness of the upper layer 4 of resist above the position of each selected structure 1), a step of selecting at least one selected structure 1 to be exposed to the e-beam lithography, this selection being based on detected light 14 emitted by the selected structure 1.

The step of selecting the at least one selected structure 1 is based:
on a wavelength and/or
on a polarization and/or
on an intensity and/or
on bunched or antibunched emission characteristics
of light 14 emitted by each selected structure 1 and detected by the optical device 8, and/or an estimated lifetime of each selected structure 1. This lifetime estimation can be based on time resolved fluorescence measurement.

From the CCD camera fluorescence microscopy image of the emitters 1 and the alignment marks 21, an electron beam exposure pattern is created using a compatible software. The image dimensions are calibrated and its center is treated as the origin. The nanocrystals 1 to be exposed are assigned the coordinates accordingly. Around each selected structure 1, the shape to be exposed region is drawn.

For example, as illustrated in FIG. 4:
many circles 22 of diameters 600 nm,
many circles 23 of diameters 1000 nm, and
many circles 24 of diameters 1500 nm,
respectively, centered on different selected structures 1, have been drawn.

On the fluorescence image, flags are placed at the respective centers of three alignment holes 21 (one hole 21 per lattice 18). Raith ELPHY Quantum software has been used for the task. FIG. 4 shows the electron beam writing exposure pattern drawn on the fluorescence image.

The process embodiment according to the invention then comprises the step of putting the sample 2 in an electron-beam microscopy device (not illustrated).

The process embodiment according to the invention comprises the step of, using the electron-beam device, imaging or determining the position of each marker 21 with reference to the electron-beam device.

The sample 2 is scanned rapidly with scanning electron microscopy and the alignment lattices 18 are observed. The scanning should be quick and very optimized because a slow scan or multiple scans on the same area, especially at a high voltage, can expose the scanned PMMA and render the area useless for lithography. After zooming in on the alignment holes 21, the marker positioning is confirmed, thus making the scanning electron microscopy output correspond with the fluorescence image via the electron beam lithography software. The electron beam is cut temporarily.

The process embodiment according to the invention thus comprises, using:
the position of each marker 21 with reference to the electron-beam device, and
the position of each selected structure 1 and the positions of the markers 21 with reference to the optical device 8
the step of deducing the position of each selected structure 1 with reference to the electron-beam device.

The process embodiment according to the invention then comprises the step of, using the electron-beam device, exposing to an electron beam the upper layer 4 of resist above the position of each selected structure 1.

The writing procedure then commands the electron beam to expose the pattern with the designated exposure charge doses. This process takes about 1 minute. Mentioned below are the electron-beam parameters that we have been used successfully:
Voltage=10 kV
Working distance=8 mm
Aperture=10 μm
Writefield=100 μm
Number of vertices per circle=128
Exposure dose (also called area dose, see the table below)

| Circle diameter (nm) | Exposure dose (μC/cm$^2$) |
| --- | --- |
| 600 nm (circles 22 of FIG. 4) | 45 μC/cm$^2$ |
| 1000 nm (circles 23 of FIG. 4) | 40 μC/cm$^2$ |
| 1500 nm (circles 24 of FIG. 4) | 30 μC/cm$^2$ |

The electron beam exposure parameters stated here are with respect to a 50 nm thick PMMA layer (weight average molar mass, $M_w$=101000) and 500 nm of LOR5A (thickness prevent the electron from destroying the emitter below).

These charge dose values were found after studying the parameters for sufficient exposure of layer 4 without deteriorating fluorescence of individual emitter 1.

The upper resist 4 of thickness $t_{RU}$ is an electron resist. In the electron beam lithography step, the lower resist 3 of thickness $t_{RL}$ protects the structure 1 of concern from destruction due to electrons. The amount of electron dose is chosen to be at least that is required to expose the upper resist 4. For a given thickness of the upper resist 4 and electron dose, the thickness and type of the lower resist 3 is chosen to be such that the structure on which the electron-beam lithography is being performed is not completely destroyed by the electrons of the electron beam.

The process embodiment according to the invention then comprises the step of, using a solvent or a chemical solution, removing all the part of the at least two layers of resist 3, 4 previously submitted to the electron beam, i.e. a step of removing all the thickness of the upper layer 4 of resist above the position of each selected structure 1 but no part or only an incomplete part of the thickness of the lower layer 3 of resist above the position of each selected structure 1: after the electron beam exposure, the sample 2 is taken out of the electron-beam microscopy device, and immersed inversely and shaken in a bath of MIBK (methyl isobutyl ketone) and isopropanol (mixed in a ratio of 1:3) for 45s at 20 to 21° C.

Then the sample 2 is cleaned by immersing it in a bath of isopropanol, and is blow-dried. This procedure removes the exposed PMMA, and marks the end of step of FIG. 1(*c*). A reflection microscopy image after etching with MIBK the electron beam exposed layer 4 (PMMA) is given in FIG. 5.

The process embodiment according to the invention then comprises the step of, using another solvent or chemical solution different from the previous solvent or chemical solution, removing part or all the remaining thickness of the lower layer 3 of resist above the position of each selected structure 1.

Layer 3 (LOR®5A) beneath the etched holes 22, 23, 24 in PMMA is removed by immersing the sample 2 (inverted) in a bath of Microposit® MF®319 (a commercial developer manufactured by Shipley Co.) for 3 to 5s. This removes layer 3 (LOR®5A) from beneath the etched layer 4 (PMMA) and creates above each selected emitter 1 a hole 10 in layer 3 and an undercut 12 in the layer 4 (PMMA) as shown in step of FIG. 1(d).

The image of FIG. 6 is a fluorescence microscopy image of the working area after the development of layer 3 (LOR®5A). Material of layer 3 (LOR®5A) is a luminescent material. Therefore, its removal from some regions makes them appear darker in the image. FIG. 6 shows several selected emitters 1 (white spots) inside developed holes 22, 23, 24.

As shown in FIG. 1(e), the process embodiment according to the invention then comprises the step of depositing a metallic layer 11 (or "patch" 11) in contact with the sample 2 and above the position of each selected structure 1, where all the thickness of the first 3 layer of resist and of the second 4 layer of resist have been removed.

The plasmonic metal patch 11 and film 111 is deposited by physical vapor deposition.

As shown in FIG. 1(f), sample 2 is then immersed inverted and shaken in a bath of MF®319 for about 50s to perform the liftoff. This procedure removes layer 3 (LOR®5A), layer 4 (PMMA) and plasmonic metal film 111 from the vicinity of the plasmonic metal patch 11 located above each selected emitter 1, thus resulting in a plasmonic metal patch antenna.

FIG. 7 illustrates the measurement of the lifetime of a selected structure 1 (CdSe/CdS quantum dot) before the electron-beam lithography (line 19) and after the electron-beam lithography (line 20). In both the cases, the lifetime was noted to be 11 ns, which shows that the invention, due to its electron exposure prevention strategy, does not damage or change the emitter 1. Lifetime estimation is done by time resolved fluorescence measurement.

Though the process according to the invention includes electron-beam lithography, the emitters 1 above which the lithography is carried out are protected from direct and destructive electron exposure. Therefore, this technique can be used even on emitters 1 that are damaged by direct electron exposure. According to the invention, electron-beam lithography can be used to deterministically fabricate single emitter structures without exposing the emitter 1 directly and destructively to the electrons of the writing beam, and this is possible because the imaging of emitters 1 is not done using the conventional methods of scanning electron microscopy (which involves direct interaction of electrons with the emitters, both scanning electron microscopy and electron-beam lithography being carried out in the same machine) but with optical excitation and detection. According to the embodiment of process according to the invention, the optical fluorescent image is used as an electron-beam writing pattern and the selected areas are exposed to pre-configured electron doses, which expose the resist 4 without damaging the emitters 1 beneath as they are protected by the lower thick layer 3 of the resist.

The process according to the invention achieve the objective of realizing plasmonic (or photonic) nanostructures in which nanoemitters 1 are deterministically placed exactly at the position for which the resonant electromagnetic field is maximum, and thus the interaction between the emitters 1 and the field is as well maximum. Deterministic positioning of emitters 1 inside nanostructures means that the specific selected nanoemitters 1 with desirable properties (like emission wavelength, lifetime, polarization, etc.) can be chosen and included inside the fabricated nanostructure with control over the lateral and vertical positioning of the nanoemitter. The lithographic size attainable by the invention is limited by the resolution of electron-beam lithography (which is has a higher resolution than photolithography).

The invention can be used at room temperature or at ultra low temperatures.

The invention allows selecting any emitter(s) 1 [fragile or robust, single or aggregates] from randomly distributed emitters 1 and perform lithography above them. Though in the FIGS. 1(a) to 1(f) the emitters 1 seem to aligned, but these emitters can be randomly oriented as well.

The invention works at room temperature.

The invention works also at low temperature.

Of course, the invention is not limited to the examples which have just been described and numerous amendments can be made to these examples without exceeding the scope of the invention.

The invention is not limited to the fabrication of the antenna of FIG. 1(f).

The invention can be used to fabricate a variety of photonic structures that use single or multiple fluorescent structures 1 like quantum dots, nitrogen vacancy centers in nanodiamonds, etc. Examples of such photonic structures are single structure plasmonic patch antennas, metallo-dielectric antennas, Tamm structures, etc.

The precision of the technique can be mainly improved by better calibration of distances on the fluorescence microscopy image (by using more appropriate optics, sub-pixel resolution) and more precise electron microscopy scanning of optical markers.

The following fields/devices would benefit from this invention:

1) Any single structure device which requires controlled and optimal positioning of the structure inside the device.

2) Single structure light emitting devices, which include promising single photon sources and entangled photons sources for quantum information.

3) Single photon detectors, and detectors of photon states.

4) Microlaser with a set of structures optimally coupled to a cavity.

5) A variety of nanostructured devices that require accurate nanometric positioning of sensitive and low luminescence structures (e.g., colloidal quantum dots, fluorescent molecules, etc.).

In different variants that can be combined:
- as illustrated by FIG. 8(a) (corresponding to step of FIG. 1(a)), FIG. 8(b) (corresponding to step of FIG. 1(c)), FIG. 8(c) and FIG. 8(d), the at least two layers of resist can comprise three or more layers of resist. For example, lower layer 3 can be separated in several layers 3a, 3b and the chemical development step of FIG. 1(d) can be separated in several chemical development steps of FIGS. 8(c) and 8(d), so that the bottom resists 3a, 3b are etched by chemical development successively in order to reach an area of interest; and/or
- as illustrated in FIG. 9, the process according to the invention can fabricate a plurality of antennas on the same sample 2; and/or
- as illustrated in FIG. 10, the process according to the invention can comprise a step of depositing a dielectric layer 37 above and in contact with the metallic layer 11, preferably encapsulating layer 11 of each antenna, in order to obtain a least one metallo-dielectric antenna; To place a dielectric cap 37 on each patch 11, the lithography is performed two times: first for placing the patch 11 and then for placing the dielectric cap 37 on the patch 11; and/or
- as illustrated in FIG. 11, layer 6 of sample 2 is not necessary metallic and can be absent or can be replaced for example by a Bragg mirror 9 in order to obtain a least one Tamm structure; and/or in the fabricated structures, the thicknesses of the resists 3, 4, substrate 5, metal film 6, dielectric layer 7a, 7b, and the patch 11 can be modified as required. The same applies to the materials and shapes as well. For example, the substrate can be any suitable material like Si, glass, Ag, etc.; and/or the patch 11 above the structure 1 can be any plasmonic metal like Au, Ag, Al, Pt, etc. or some other novel material; and/or layer 11 can be a non-metallic and/or semiconductor and/or dielectric layer 11; and/or layers 7a, 7b can be absent, in the case of a large structure 1 which is placed directly on layer 5 or 6; and/or the set of possible structures 1 includes many more possibilities than a quantum dot, a nitrogen vacancy center in a nanodiamond, or a fluorescent molecule; and/or each structure 1 is not necessary a light or fluorescence emitter 1, and/or the radiation 14 received from a structure is not necessary fluorescence light but can be a transmitted or reflected radiation. The scope of the invention can be extended for non-emitter structures 1, which can be imaged by reflection far field optical microscopy or transmission microscopy for determining their positions with reference to the optical device 8. If transmission optical microscopy is used for optical imaging, then layer 5, 6, 7a and/or 7b is adequately transparent. The invention is not just limited to fluorescent emitters 1; other objects (which may not be fluorescent emitters, and may or may not show sensitivity to light) can also benefit from the invention. For example, structures 1 can be metal disks on which some non-fluorescent molecules are attached: these molecules can be destroyed or transformed due to interaction with electrons, so we create alignment markers 21 by optical lithography and image the disks 1 and the alignment markers 21 with reflection microscopy. This image is used to draw the electron beam exposure pattern, and using the electron beam lithography we place metal patches 11 at the desired position above the molecules; therefore in the previous description the expression "emitter" or "fluorescent emitter" can be generalized to any structure; and/or It is not necessary to remove all the remaining thickness of the lower layer 3 of resist above the position of the selected structure 1. For example, to increase the vertical distance of the metallic patch 11 above the selected emitter 1, we can leave some part of layer 3 above the emitter 1; and/or It is possible to sandwiching the emitter(s) 1 between a layer 7a (for example of SiO2) and a layer 7b (for example of PMMA), without the layer(s) 5 and/or 6.

Of course, the different characteristics, forms, variants and embodiments of the invention can be combined with each other in various combinations to the extent that they are not incompatible or mutually exclusive. In particular all variants and embodiments described above can be combined with each other.

The invention claimed is:

1. A lithography process on a sample (2) comprising at least one structure (1), said process comprising:
   putting above the sample (2) at least two layers (3, 4) of resist comprising a lower layer (3) of resist in contact with the sample (2) and an upper layer (4) of resist above the lower layer of resist (3),
   using an optical device (8), receiving a radiation (14) from a selected structure (1) and imaging or determining, with reference to the optical device (8), a position of the selected structure (1) and positions of markers (21) integral with the sample (2),
   using an electron-beam device, imaging or determining the position of each marker (21) with reference to the electron-beam device,
   using:
     the position of each marker (21) with reference to the electron-beam device, and
     the position of the selected structure (1) and the positions of the markers (21) with reference to the optical device (8),
   deducing the position of the selected structure (1) with reference to the electron-beam device, and
   using the electron-beam device, exposing to an electron beam the upper layer (4) of resist above the position of the selected structure (1) in order to remove all the thickness of the upper layer (4) of resist above the position of the selected structure (1) but no part or only an incomplete part of the thickness of the lower layer (3) of resist above the position of the selected structure (1).

2. The process according to claim 1, further comprising, after removing all the thickness of the upper layer (4) of resist above the position of the selected structure (1), another removing step comprising removing at least a part of the remaining thickness of the lower layer (3) of resist above the position of the selected structure (1).

3. The process according to claim 2, wherein imaging or determining the position of the selected structure (1) with reference to the optical device (8) comprises a step of acquiring an image imaging the markers (21) and a fluorescence radiation (14) from the selected structure (1).

4. The process according to claim 2, wherein the markers (21) are made by optical lithography.

5. The process according to claim 2, wherein the lower layer (3) has a thickness of at least 50 nm.

6. The process according to claim 1, wherein imaging or determining the position of the selected structure (1) with reference to the optical device (8) comprises a step of acquiring an image imaging the markers (21) and a fluorescence radiation (14) from the selected structure (1).

7. The process according to claim 6, wherein the markers (21) are made by optical lithography.

8. The process according to claim 1, wherein the markers (21) are made by optical lithography.

9. The process according to claim 8, wherein the markers (21) are made by a laser with the same optical device (8).

10. The process according to claim 1, wherein the markers are made at least on the upper layer of resist (4).

11. The process according to claim 1, wherein the lower layer (3) has a thickness of at least 50 nm.

12. The process according to claim 1, wherein the upper layer (4) has a thickness of less than 5 µm.

13. The process according to claim 1, further comprising, before the steps of exposing to an electron beam the upper layer (4) of resist and removing all the thickness of the upper layer (4) of resist above the position of the selected structure (1), a step of selecting the selected structure (1) based on the radiation (14) from the selected structure (1).

14. The process according to claim 13, wherein the step of selecting the selected structure (1) is based:
   on a wavelength, and/or
   on a polarization, and/or
   on an intensity, and/or on bunched or antibunched emission characteristics of the radiation (14) from the selected structure (1) and/or an estimated lifetime of the selected structure (1).

15. The process according to claim 1, further comprising a step of deposing a metallic layer (11) above the position of the selected structure (1), where all the thickness of the upper (4) layer of resist have been removed.

16. The process according to claim 1, wherein the at least one structure (1) is comprised in the sample inside a structure layer (7a, 7b).

17. The process according to claim 16, wherein the at least one structure (1) is comprised in the sample between two layers (7a, 7b) of the same dielectric material forming the structure layer.

18. The process according to claim 16, wherein:
one first side of the structure layer (7a, 7b) is in contact with one (3) of the at least two layers (3, 4) of resist, and
one second side of the structure layer (7a, 7b) is in contact with a metallic layer (6) or a Bragg mirror.

19. The process according to claim 1, wherein each structure (1) is quantum dot, a nitrogen vacancy center in a nanodiamond, or a fluorescent molecule.

20. The process according to claim 1, wherein the markers are made on the lower layer of resist (3) and on the upper layer of resist (4).

\* \* \* \* \*